United States Patent [19]
Tonello et al.

[11] Patent Number: 5,204,634
[45] Date of Patent: Apr. 20, 1993

[54] PHASE-LOCKED LOOP DEMODULATOR HAVING LOOP FILTER CONTROLLED BY LOCK DETECTOR

[75] Inventors: Emile Tonello, Toulouse; Christian Herbere, Plaisance Du Touch, both of France

[73] Assignee: Alcatel Espace, Courbevoie, France

[21] Appl. No.: 846,023

[22] Filed: Mar. 5, 1992

[30] Foreign Application Priority Data

Mar. 8, 1991 [FR] France .................... 91 02817

[51] Int. Cl.$^5$ .................... H03D 3/00; H03L 7/093
[52] U.S. Cl. .................... 329/325; 329/307; 329/346; 331/DIG. 2; 375/81; 455/260
[58] Field of Search ............ 329/302, 307, 308, 309, 329/325, 326, 346, 360; 331/DIG. 2; 375/81, 120; 455/260

[56] References Cited

U.S. PATENT DOCUMENTS

| | | | |
|---|---|---|---|
| 3,983,501 | 9/1976 | Lindstrom | 329/122 |
| 4,575,684 | 3/1986 | Stamm | 329/307 |
| 4,937,536 | 6/1990 | Reinhardt et al. | 331/8 |
| 5,072,192 | 12/1991 | Noguera et al. | 329/325 |

FOREIGN PATENT DOCUMENTS

1307888 2/1973 United Kingdom .

OTHER PUBLICATIONS

Patent Abstracts of Japan, vol. 010, No. 150 (E403) May 31, 1986 & JP-A-61 009 021 (Sony KK) Jan. 16, 1986.
Patent Abstracts of Japan, vol. 7, No. 182 (E-192) (1327) Aug. 11, 1983 & JP-A-58 186 010 (Mitsubishi Denki K.K.), May 25, 1983.
Patent Abstracts of Japan, vol. 005, No. 133 (E-071) Aug. 25, 1981 & JP-A-56 069 934 (Pioneer Electronic Corp) Jun. 11, 1981.

*Primary Examiner*—Siegfried H. Grimm
*Attorney, Agent, or Firm*—Sughrue, Mion, Zinn, Macpeak & Seas

[57] ABSTRACT

A phase-locked loop demodulator comprises a mixer and a loop filter between an input and an output. A voltage-controlled oscillator is connected between its output and an input of the mixer. The demodulator further comprises a lock-on detector circuit whose output signal is adapted to increase the static loop gain after lock-on by modifying the characteristics of the filter.

6 Claims, 2 Drawing Sheets

PHASE-LOCKED LOOP DEMODULATOR HAVING LOOP FILTER CONTROLLED BY LOCK DETECTOR

BACKGROUND OF THE INVENTION

1. Field of the invention

The invention concerns a phase-locked loop demodulator.

1. Description of the prior art

The Floyd Gardner manual "Phaselock Techniques" (second edition: pages 182-183) describes a prior art phase-locked loop demodulator comprising an input bandpass filter, a phase-locked loop comprising a phase detector, a loop filter, a voltage-controlled oscillator (VCO) and a de-emphasis filter at the output of the phase-locked loop.

In a phase-locked loop of this kind any offset between the frequency (Fe) of the carrier to be demodulated and the VCO rest frequency $(F_{vco})_o$ due to aging of the VCO, carrier drift, etc produces a static phase error at the output of the loop phase comparator causing:

degradation of the demodulator threshold, and
increased sensitivity to the phenomenon of "clicks".

Phase comparators are non-linear devices and they operate optimally with a null static phase error.

The static phase error due to a frequency offset between $F_e$ and $(F_{VCO})_o$ is given by the equation:

$$\Delta\phi = \frac{F_e - (F_{VCO})_o}{K_T}$$

The value of $K_T$ is limited by:

the difficulty of implementing high-gain broadband amplifiers, the respective sensitivities of the phase comparator and the VCO, and the offsets and drift generated by the amplifiers.

The major drawback of a phase-locked loop of this kind is its very high sensitivity to static phase errors caused by drift affecting certain components of a receiver system and very strongly degrading the demodulator threshold.

An object of the invention is to palliate such drawbacks.

SUMMARY OF THE INVENTION

The invention consists in a phase-locked loop demodulator comprising a mixer and a loop filter between an input and an output and a voltage-controlled oscillator connected between its output and an input of said mixer, the demodulator further comprising a lock-on detector circuit whose output signal is adapted to increase the static loop gain after lock-on by modifying the characteristics of said filter.

In a first preferred embodiment the loop filter is an infinite gain amplifier having one input grounded and the other input connected to the output of the mixer through a resistor and an RC network is connected between the second input and the amplifier output.

In a second preferred embodiment the mixer has two differential outputs and the loop filter is an infinite gain amplifier whose inputs are connected to the mixer outputs through two resistors, an RC network is provided between the first input and ground and another RC network is provided between the second input and the amplifier output.

The RC network (or each RC network) comprises in three parallel branches:

a first resistor, a second resistor in series with a capacitor, and a third resistor in series with an electrically operated switch controlled by the output signal of the lock-on detector circuit;

and the value of said first resistor is very much greater than the value of said third resistor whose value is very much greater than the value of said second resistor.

The lock-on detector circuit comprises a first coupler adapted to sample the input signal and a second coupler adapted to sample the VCO output loop signal respectively connected directly and through a $\pi/2$ phase-shifter to a mixer whose output delivers a locking signal.

A demodulator of this kind has many advantages including:

fast correction of phase errors, no low frequency limitation on demodulation, and extremely simple implementation (no adjustments).

The features and advantages of the invention will emerge from the following description given by way of non-limiting example with reference to the appended drawings.

DETAILED DESCRIPTION OF THE INVENTION

Figure 1:
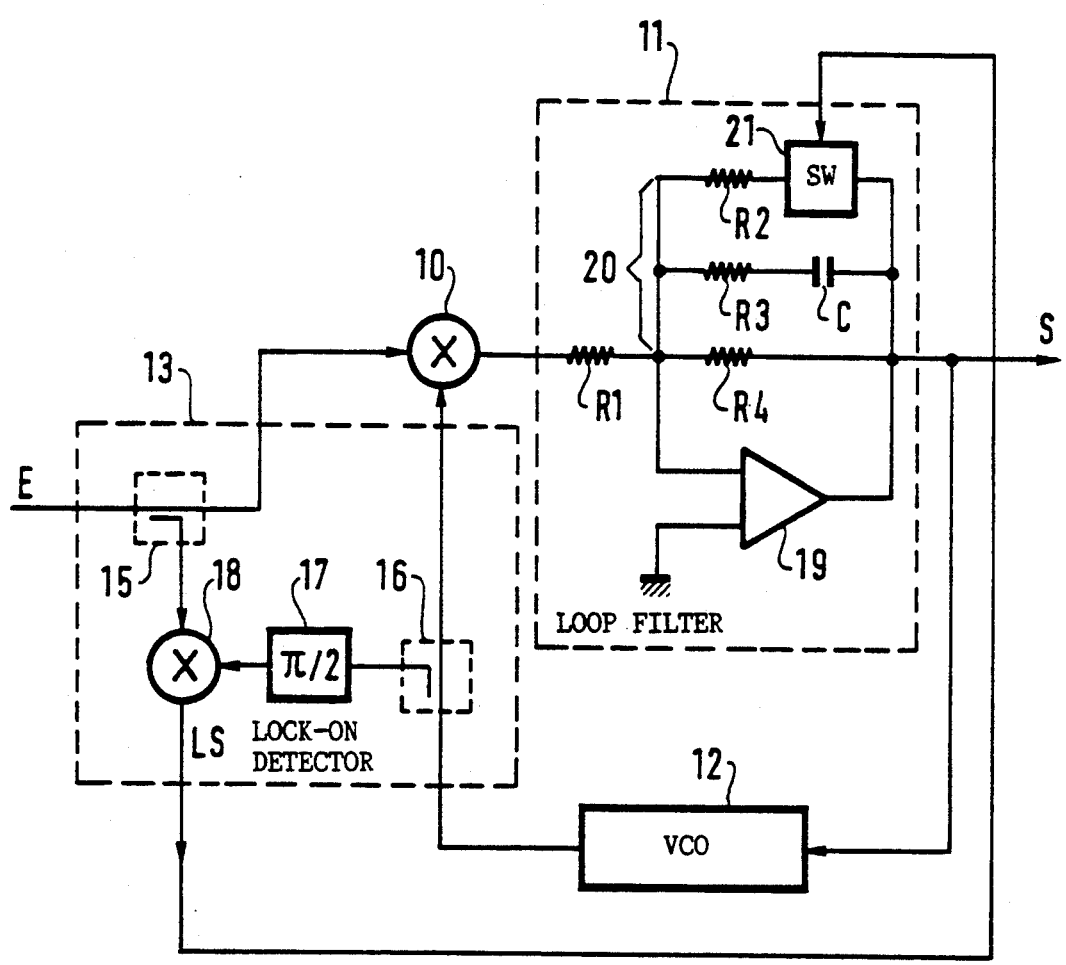
FIG. 1 shows a first embodiment of a demodulator in accordance with the invention.

The phase-locked loop demodulator in accordance with the invention shown in FIG. 1 conventionally comprises between its input E and its output S:

a mixer 10, a loop filter 11, and a voltage-controlled oscillator (VCO) 12 connected between the output S and an input of the mixer.

This demodulator further comprises a lock-on detector circuit 13 which comprises a first coupler 15 adapted to sample the input signal and a second coupler 16 adapted to sample the loop signal at the VCO output, the couplers 15 and 16 being respectively connected directly and via a $\pi/2$ phase-shifter 17 to a mixer 18 whose output supplies a locking signal LS.

In this demodulator the loop filter is an infinite gain amplifier 19 having one input grounded and the other input connected to the output of the mixer 10 through a resistor R1. An RC network 20 is connected between the second input and the amplifier output.

This network comprises in three parallel branches:

a resistor R4, a resistor R3 in series with a capacitor C, and a resistor R2 in series with an electrically controlled switch 21 controlled by the locking signal LS; in this network R4 $>>$ R2 $>>$ R3.

When the demodulator is locked on, a demodulator of this kind increases the static gain without significantly modifying to the loop parameters (loop bandwidth and damping coefficient).

This demodulator operates as follows:

Before lock-on the switch 21 is closed because the locking signal LS is not asserted.

The loop (10, 11, 12) is in equilibrium and its loop parameters are:

Static gain:

$$K_{To} = K_v k_\phi \left( \frac{R_2}{R_1} \right)$$

Loop frequency:

$$f_n = \frac{1}{2\pi} \left( \frac{K_\phi K_v}{R2C} \times \frac{R2}{R1} \right)^{\frac{1}{2}} = \frac{1}{2\pi} \left( \frac{K_v K_\phi}{R1C} \right)^{\frac{1}{2}}$$

Damping coefficient:

$$\xi = \pi f_n \tau_2 = \frac{1}{2} \left( \frac{K_v K_\phi}{R1C} \right)^{\frac{1}{2}} R3C$$

Note that the values of the parameters $f_n$ and $\xi$ depend only on $K_v$, $K_\phi$, $R_1$, $R_3$ and C.
If the switch 21 is not operated, the phase error is:

$$\Delta \phi_o = \frac{\Delta F}{KT_o} = \frac{\Delta F}{K_v k_\phi R2/R1}$$

When the phase-locked loop is locked onto an input carrier the locking signal LS is asserted and opens the switch 21.
As previously explained, the values of $f_n$ and $\xi$ remain the same.
However, KT becomes $$KT_a = K_v \times K_\phi \left( \frac{R4}{R1} \right) \text{ and } \Delta\phi_a = \frac{\Delta F}{K_v K_\phi R4/R1}$$

Figure 2:
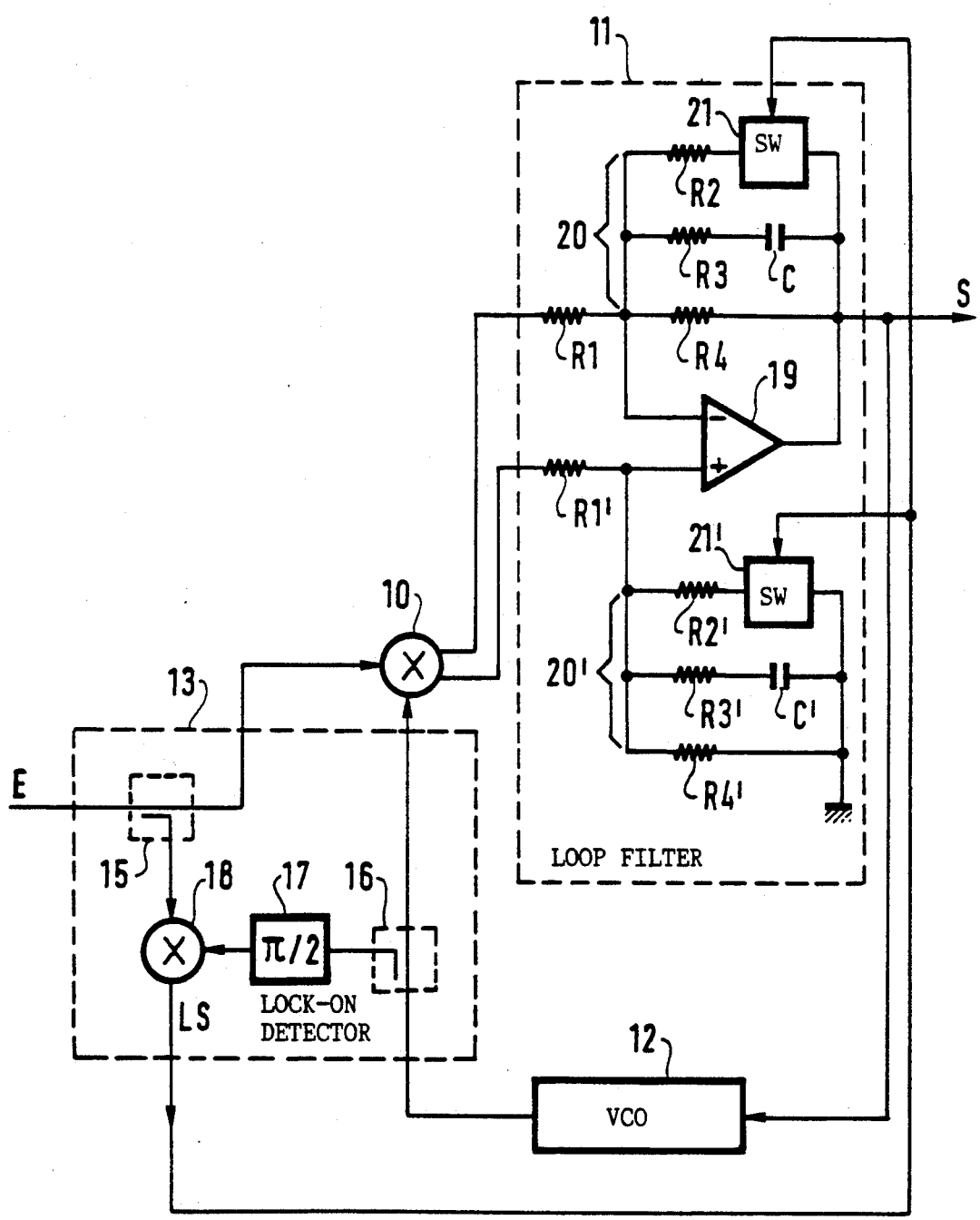
FIG. 2 shows a second embodiment of a demodulator in accordance with the invention.

The phase error correction term is approximately R4/R2.
This can provide a gain switching factor in the order of 100, for example.
Static gain switching is needed because the maximum gain in standby mode is limited by:
the problem of implementing high gain amplifiers with a null offset,
drift affecting the phase comparator and the VCO, limited acquisition bandwidth, and
guaranteed starting of the VCO at a frequency near the input frequency.
It is to be understood that the present invention has been described and shown by way of preferred example only and that its component parts may be replaced with equivalent parts without departing from the scope of the invention.
Thus in the demodulator in accordance with the invention shown in FIG. 2 the mixer 10 has two differential outputs. The loop filter 11 is an infinite gain amplifier whose inputs are connected to respective outputs of the mixer 10 through two resistors Rl and R1' An RC network 20' is connected between the first input and ground and a second RC network 20 is connected between the second input and the output of the amplifier. In these networks R4 >>R2 >>R3 and R4'>>R2' >>R3'.

What is claimed:

1. A phase-locked loop demodulator comprising a mixer and a loop filter between an input and an output of said demodulator, and a voltage-controlled oscillator connected between said output and an input of said mixer, the demodulator further comprising a lock-on detector circuit providing a locking signal as an output signal adapted to increase a static loop gain after lock-on by modifying the characteristics of said filter without significantly modifying loop bandwidth.

2. A phase-locked loop demodulator comprising a mixer and a loop filter between an input and an output of said demodulator, and a voltage-controlled oscillator connected between said output and an input of said mixer, the demodulator further comprising a lock-on detector circuit providing a locking signal as an output signal adapted to increase a static loop gain after lock-on by modifying the characteristics of said filter, wherein said loop filter comprises:
an infinite gain amplifer having one input grounded and having a second input and an otput;
a resistor connecting said second input to an output of said mixer; and
an RC network connected between said second input and the output of said amplifier.

3. A phase-locked loop demodulator comprising a mixer and a loop filter between an input and an output of said demodulator, and a voltage-controlled oscillator connected between said otput and an input of said mixer, the demodulator further comprising a lock-on detector circuit providing a locking signal as an output signal adapted to increase a static loop gain after lock-on by modifying the characteristics of said filter, wherein said mixer has two differential outputs and said loop filter is an infinite gain amplifier having two inputs connected to respective outputs of said mixer through respective resistors, and an RC network is provided between said first input and ground and a second RC network is provided between said second input and the output of said amplifier.

4. A demodulator according to claim 2, wherein said RC network comprises:
a first branch comprising a first resistor,
a second branch in parallel with said first branch and comprising a second resistor in series with a capacitor, and
a third branch in parallel with said first branch and comprising a third resistor in series with an electrically controlled switch controlled by the output signal of said lock-on detector circuit, and
wherein the value of aid first resistor is very much greater than the value of said third resistor whose value is very much greater than the value of said second resistor.

5. A demodulator according to claim 3, wherein each RC network comprises:
a first branch comprising a first resistor,
a second branch in parallel with said first branch and comprising a second resistor in series with a capacitor, and
a third branch in parallel with said first branch and comprising a third resistor in series with an electrically controlled switch controlled by the output signal of said lock-on detector circuit, and
wherein the value of aid first resistor is very much greater than the value of said third resistor whose value is very much greater than the value of said second resistor.

6. A demodulator according to claim 1, wherein said lock-on detector circuit comprises a first coupler adapted to sample the input signal and a second coupler adapted to sample the loop signal at the output of said VCO and said couplers are respectively connected directly and through a $\pi/2$ phase-shifter to a mixer whose output supplies said locking signal.

* * * * *